(12) United States Patent
Huang et al.

(10) Patent No.: US 6,838,900 B2
(45) Date of Patent: Jan. 4, 2005

(54) MIDDLE PULL-UP POINT-TO-POINT TRANSCEIVING BUS STRUCTURE

(75) Inventors: Jin-Cheng Huang, Taipei Hsien (TW); Ching Fu Chuang, Taipei (TW)

(73) Assignee: VIA Technologies, Inc., Taipei (TW)

( * ) Notice: Subject to any disclaimer, the term of this patent is extended or adjusted under 35 U.S.C. 154(b) by 326 days.

(21) Appl. No.: 09/967,746

(22) Filed: Sep. 28, 2001

(65) Prior Publication Data

US 2002/0167331 A1 Nov. 14, 2002

(30) Foreign Application Priority Data

Nov. 14, 2000 (TW) .......................................... 89124086 A

(51) Int. Cl.$^7$ ............................................... H03K 17/16
(52) U.S. Cl. ............................. 326/30; 326/27; 326/86; 326/21; 327/108; 327/98
(58) Field of Search .............................. 326/30, 27, 86, 326/83, 21, 26; 327/108, 98

(56) References Cited

U.S. PATENT DOCUMENTS 5,731,711 A * 3/1998 Gabara ........................ 326/30
5,872,471 A * 2/1999 Ishibashi et al. .............. 327/98

\* cited by examiner

*Primary Examiner*—Vibol Tan
(74) *Attorney, Agent, or Firm*—Rabin & Berdo, P.C.

(57) ABSTRACT

A bus architecture for the application of data transmission between distinct integrated circuits. The bus architecture includes at least one transmission line connecting with I/O pin of ICs for transmitting data. In a middle point of the transmission line, there is a middle resistor with a resistance value preferably equal to the characteristic impedance of the transmission line. In addition, there are internal pull-up resistors within the ICs, which has a first end coupled to the I/O pin and a second end coupled to the voltage source. Each pull-up resistor has a resistance value higher than the characteristic impedance of the transmission line, for example, 2 or 3 times of the characteristic impedance, for suppressing the rising edge ringback.

14 Claims, 5 Drawing Sheets

MIDDLE PULL-UP POINT-TO-POINT TRANSCEIVING BUS STRUCTURE

BACKGROUND OF THE INVENTION

1. Field of the Invention

The present invention relates in general to a bus architecture technology. In particular, the present invention relates to a bus structure with a middle pull-up element for point-to-point communication, thereby increasing the signal transmission speed and facilitating the circuit layout.

2. Description of the Related Art

Due to the high-speed requirement for electronic systems, the data transmission rate between various integrated circuits (ICs) also must be increased. There are several transmission bus architectures designed for raising the practical data transmission rate in a bus. For example, in some bus structures, such as the open scheme bus, the amplitude of the transmission signals is enhanced by utilizing the reflection effect at the receiver. Otherwise, some bus structures employ coupled resistors at the transmitter to eliminate the deviation of the transmission conditions caused by PVT factors, where P represents the manufacturing process factor, V represents the voltage factor and T represents the temperature factor. In addition, some bus structures involve DC termination resistors at both ends of the bus to eliminate reflection waves, such as the Gunning Transceiver Logic (GTL) bus. These bus technologies have their own advantages and drawbacks. The following description will focus on the open scheme bus and the GTL bus.

FIG. 1 (Prior Art) is a diagram illustrating the configuration of the open scheme bus for point-to-point communication in the prior art. Such bus structure is applied for receiving or transmitting signals between integrated circuits (ICs). As shown in FIG. 1, IC 12 and IC 14 are directly connected with transmission line 10, where one IC functions as a transmitter and the other IC functions as a receiver. Therefore, in the open scheme bus, it is quite easy to layout printed circuit boards (PCBs). Note that the output impedance of the IC serving as the transmitter should match with the characteristic impedance $Z_0$ of transmission line 10. Since the reflective index is 1 at the receiver, the reflection wave is the same as the incident wave. Accordingly, the receiver can acquire a good-quality digital waveform.

FIG. 2 (Prior Art) is a waveform diagram of voltage signals on the transmitter, the receiver and a middle point 10a in the open scheme bus shown in FIG. 1. In FIG. 2, numeral 15 represents the voltage signal on the transmitter, numeral 17 represents the voltage signal on the receiver and numeral 19 represents the voltage signal on the middle point 10a. As shown in FIG. 2, the voltage signal 15, which appears on the transmitter, requires the double of the flight time to reach the steady state. On the other hand, however, the voltage signal 17, which appears on the receiver, has a quite perfect signal waveform.

The main advantage of the conventional open scheme bus is to facilitate the circuit layout due to its simple architecture. Practically, however, the open scheme bus has some drawbacks:

(1) The prerequisite of acquiring better waveforms at the receiver is the output impedance of the transmitter must exactly match with the characteristic impedance $Z_0$ of the transmission line 10. However, the output impedance of the transmitter may vary with various operating conditions and the fabrication process. Accordingly, it requires a compensatory circuit in the transmitter to compensate the deviation of the output impedance caused by the PVT factors.

(2) Referring to FIG. 2, the voltage on the transmitter requires the double of the flight time to reach the steady state. In other words, the double of the flight time may limit the data transmission rate of the bus. If the data transmission rate exceeds the limitation, power and ground in the circuit will be unstable, and the noise and the skew of the data transmission time among various data transmission lines will be deteriorated.

Next, the structure of the GTL bus will be described as follows. FIG. 3 (Prior Art) is a diagram illustrating the configuration of the conventional multi-point transceiving GTL bus, where the voltage VTT is typically 1.2V. If the voltage VTT is changed to 1.5V, such a GTL bus version is called the GTL+ bus, which is applied to the interconnection between Intel P6 CPUs and their chipsets. As shown in FIG. 3, a plurality of transmission lines 20 are shown and connected to I/O pins of different ICs 22a, 22b, . . . and 22c. In addition, there are two pull-up resistors RT connected to both ends of the transmission line 20, respectively. The resistance value of the pull-up resistors RT is designed to match with the characteristic impedance $Z_0$ of the transmission line 20. Accordingly, there is no reflective wave in the transmission line 20 during the transmission period since the reflective indexes at both ends are zeros. The signal waveforms on the transmission line 20 are almost the same everywhere. The only difference among these signal waveforms is the arrival time.

The GTL bus is not only applied to the multi-point communication applications, but also to point-to-point communication applications. FIG. 4 (Prior Art) is a diagram illustrating the configuration of the conventional point-to-point GTL bus. In FIG. 4, the transmission lines 30, 30a and 30b have the same characteristic impedance $Z_0$. In addition, the input/output circuit of IC 32 is connected at an intersectional point of the transmission lines 30 and 30a, and the input/output circuit of IC 34 is connected at an intersectional point of the transmission lines 30 and 30b. As similar to FIG. 3, both ends of the whole transmission line, including lines 30, 30a and 30b, are connected to termination resistors RT, respectively. The resistance values of termination resistors RT are the same as the characteristic impedance $Z_0$.

FIG. 5 (Prior Art) is a waveform diagram of voltage signals on the transmitter, the receiver and a middle point 33 in the conventional GTL bus shown in FIG. 4. In FIG. 5, numeral 35 represents the voltage signal waveform on the transmitter, numeral 37 represents the voltage signal waveform on the receiver and numeral 39 represents the voltage signal waveform on the middle point 33. As shown in FIG. 5, the voltage signal waveform on the receiver is perfect and the voltage signal waveform on the transmitter reaches the steady state regardless of the length of the transmission line. Accordingly, the data transmission rate can theoretically be upgraded unlimitedly.

However, the GTL bus still has drawbacks. The first drawback is that it is necessary to mount a plurality of termination resistors at the ends of the transmission lines to have the better electricity characteristic. FIG. 6 (Prior Art) is a diagram of the layout of the conventional GTL bus on a printed circuit board. As shown in FIG. 6, there are two additional transmission lines 30a and 30b at the I/O pins of the ICs 32 and 34 to couple to termination resistors RT. Therefore, for a packaged IC with dense wiring, it is quite difficult to further interconnect for all of the I/O pins with the corresponding termination resistors RT. Since such scheme almost doubles the number of the interconnections for each IC, the circuit layout and the wiring design are complicated.

To solve the problem caused by dense interconnections, one solution is to place the termination resistors within the IC to decrease the interconnections for the IC. FIG. 7 (Prior Art) is a diagram illustrating the configuration of the conventional GTL bus when the termination resistors are placed within the IC. As shown in FIG. 7, the transmission line 30 is used to connect IC 32 with IC 34, where IC 32 is a dense-wiring IC. For the decrease of the wiring number of IC 32, the termination resistor RT is installed within IC 32. More specifically, one end of the termination resistor RT is coupled to the I/O pin of the IC 32 via an internal bonding wire 30a and the other end of the termination resistor RT is coupled to an external voltage source VTT. Since no additional interconnecting traces for coupling with the termination resistor is required, the interconnecting traces on the printed circuit board for the IC 32 does not increase.

Placing the termination resistors within the IC can truly solve the layout problem. However, since there is parasitic inductance 36 between the IC internal power source and the external power source, a noise expressed by L*dI/dT will be immediately induced as the data is transmitted or received, where L denotes the inductance value of parasitic inductor 36 and dI denotes the variation of the current flowing through the termination resistor RT within a time interval dT. Since dI is inversely proportional to the resistance value of termination resistor RT, the noise will increase as the resistance value of termination resistor RT decreases. In fact, the noise source can worsen the skew of the data transmission time among various data transmission lines and cause the errors of the transmitted data.

According to the above description, the bus structure with a reflective index of 1, such as the open scheme bus, has an advantage of easy implementation, but suffers a drawback that the voltage of the transmitter requires the double of the flight time to reach the steady state. The data transmission rate is therefore limited. On the other hand, since the GTL bus uses the termination resistors in the bus structure, the data transmission rate of such bus can be theoretically upgraded unlimitedly. However, its drawback is that the termination resistors must be connected to the I/O pins of the IC via extra lines, therefore, the circuit layout for the GTL bus is complicated. Although mounting the termination resistors within the IC can facilitate the circuit layout, the solution method may introduce another noise issue.

SUMMARY OF THE INVENTION

An object of the present invention is to provide a novel bus structure that can overcome the drawbacks of the conventional bus structures, for facilitating the circuit layout on a printed circuit board, increasing the data transmission rate and eliminating the induced noise.

The bus structure of the present invention is used for transmitting data between a first circuit with a first I/O pin and a second circuit with a second I/O pin. The bus includes a transmission line connected between the first I/O pin of the first circuit and the second I/O pin of the second circuit. A middle point of the transmission line is connected to a middle resistor connected to a voltage source. The middle point can be a center of the transmission line between the first circuit and the second circuit. In addition, the resistance of the middle resistor is substantially the same as the characteristic impedance of the transmission line. Furthermore, the first circuit comprises a first pull-up resistor with a first end coupled to the first I/O pin and a second end coupled to the voltage source. The second circuit comprises a second pull-up resistor with a first end coupled to the second I/O pin and a second end coupled to the voltage source. The resistance values of these pull-up resistors are higher than the characteristic impedance of the transmission line, for example, 2 or 3 times of the characteristic impedance, for suppressing the rising edge ringback. In addition, a switch element can be located between the pull-up resistor and the corresponding I/O pin for selectively conducting the current flow pertaining to the pull-up resistor. Since the middle resistor is placed at the middle point of the transmission line, the placement of the pull-up resistor is easy and will not increase the interconnecting traces of the IC with dense wiring. In addition, the data transmission rate is not limited by the double of the flight time required by reaching the steady state on the transmitter.

Next, the present invention discloses a printed circuit board. It includes a first integrated circuit located on the printed circuit board and having a first I/O pin and a first pull-up resistor coupled to the first I/O pin and an external voltage source; a second integrated circuit located on the printed circuit board and having a second I/O pin and a second pull-up resistor coupled to the second I/O pin and the external voltage source; a transmission line provided on the printed circuit board between the first I/O pin of the first integrated circuit and the second I/O pin of the second integrated circuit, the resistance of the first pull-up resistor and the second pull-up resistor being higher than the characteristic impedance of the transmission line; and a middle resistor located on the printed circuit board, the middle resistor having a first end coupled to a middle point of the transmission line between the first integrated circuit and the second integrated circuit and a second end coupled to the external voltage source.

The present invention also discloses an integrated circuit. It comprises an internal circuit, an input/output circuit coupled to the internal circuit and an I/O pin for transmitting data to an external transmission line coupled to the I/O pin and a pull-up resistor coupled to the I/O pin. The resistance value of the pull-up resistor is higher than the characteristic impedance of the external transmission line, for example, 2 or 3 times of the characteristic impedance. In addition, a switch element can be located between the pull-up resistor and the corresponding I/O pin for selectively conducting the current flow pertaining to the pull-up resistor.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE PREFERRED EMBODIMENT

The present invention provides a novel structure of transmission lines in a bus for solving the drawbacks of the conventional bus architectures. These drawbacks include the limitation on the data transmission rate for the Open Scheme bus that is introduced by the double of the flight time and the layout issue raised by the dense wiring around the IC for the GTL bus. The present embodiment is used to illustrate the spirit of the invention. Note that the present embodiment is not intended to limit the scope of the present invention. For those skilled in the art, the same principle described below can be employed to achieve the purpose of the present invention without departing from the spirit of the invention.

Figure 1:
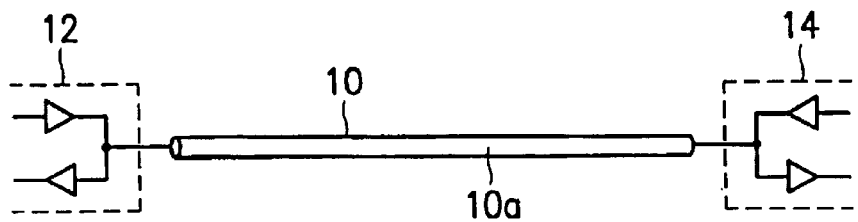
FIG. 1 (Prior Art) is a diagram illustrating the configuration of the open scheme bus for point-to-point communications in the prior art.
Figure 2:
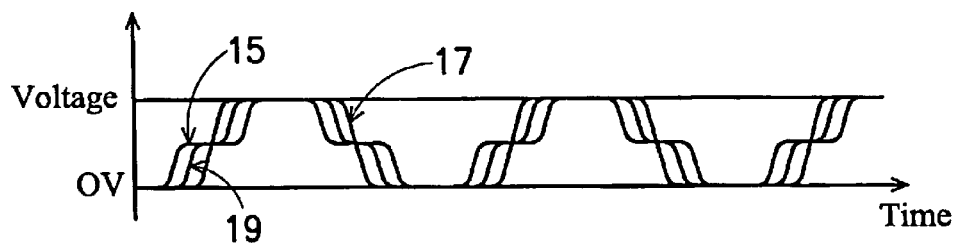
FIG. 2 (Prior Art) is a waveform diagram of voltage signals on the transmitter, the receiver and the middle point 10a in the open scheme bus shown in FIG. 1.
Figure 3:
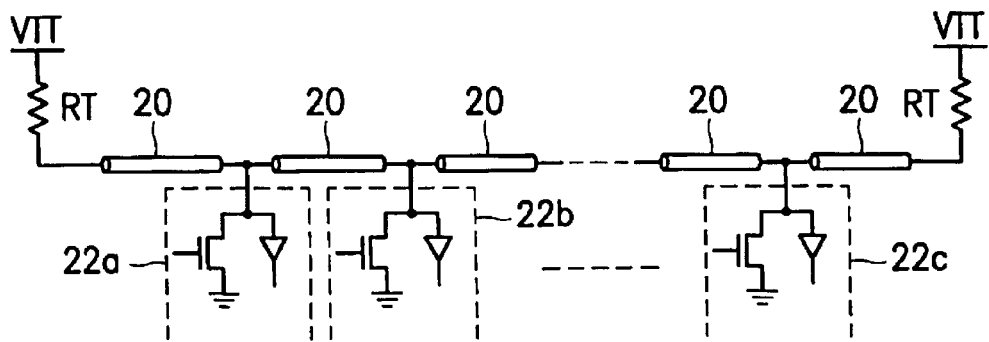
FIG. 3 (Prior Art) is a diagram illustrating the configuration of the conventional multi-point GTL bus, where the voltage VTT is typically 1.2V.
Figure 4:
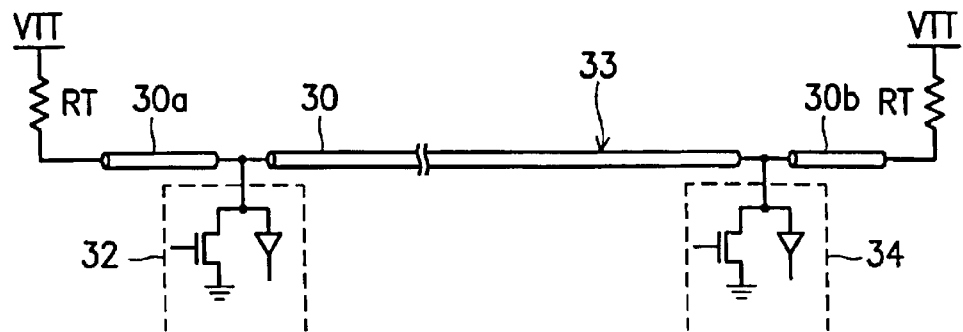
FIG. 4 (Prior Art) is a diagram illustrating the configuration of the conventional point-to-point GTL bus.
Figure 5:
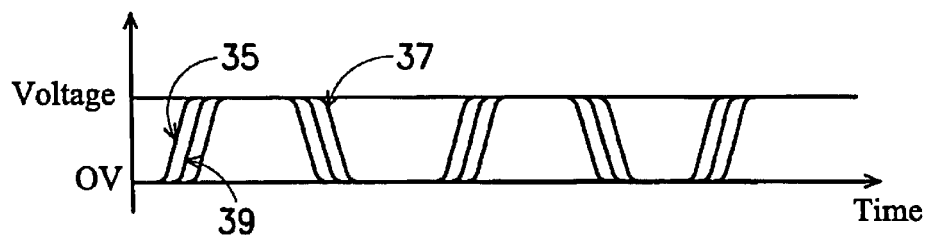
FIG. 5 (Prior Art) is a waveform diagram of voltage signals on the transmitter, the receiver and the middle point 33 in the conventional GTL bus shown in FIG. 4.
Figure 6:
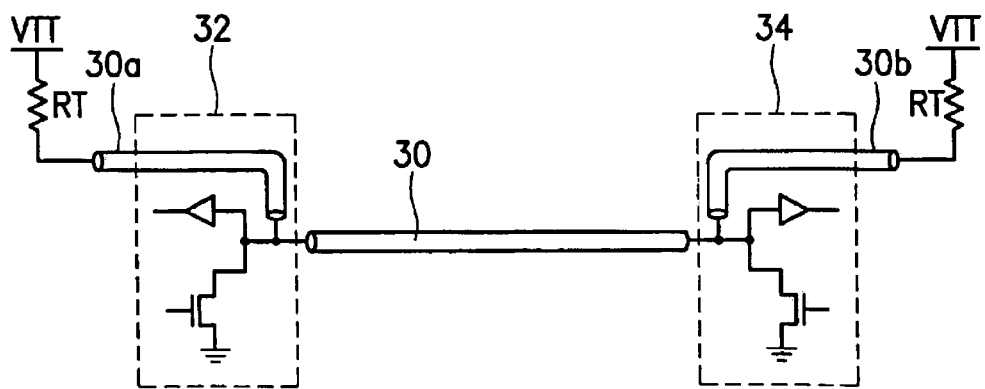
FIG. 6 (Prior Art) is a diagram of the layout of the conventional GTL bus on a printed circuit board.
Figure 7:
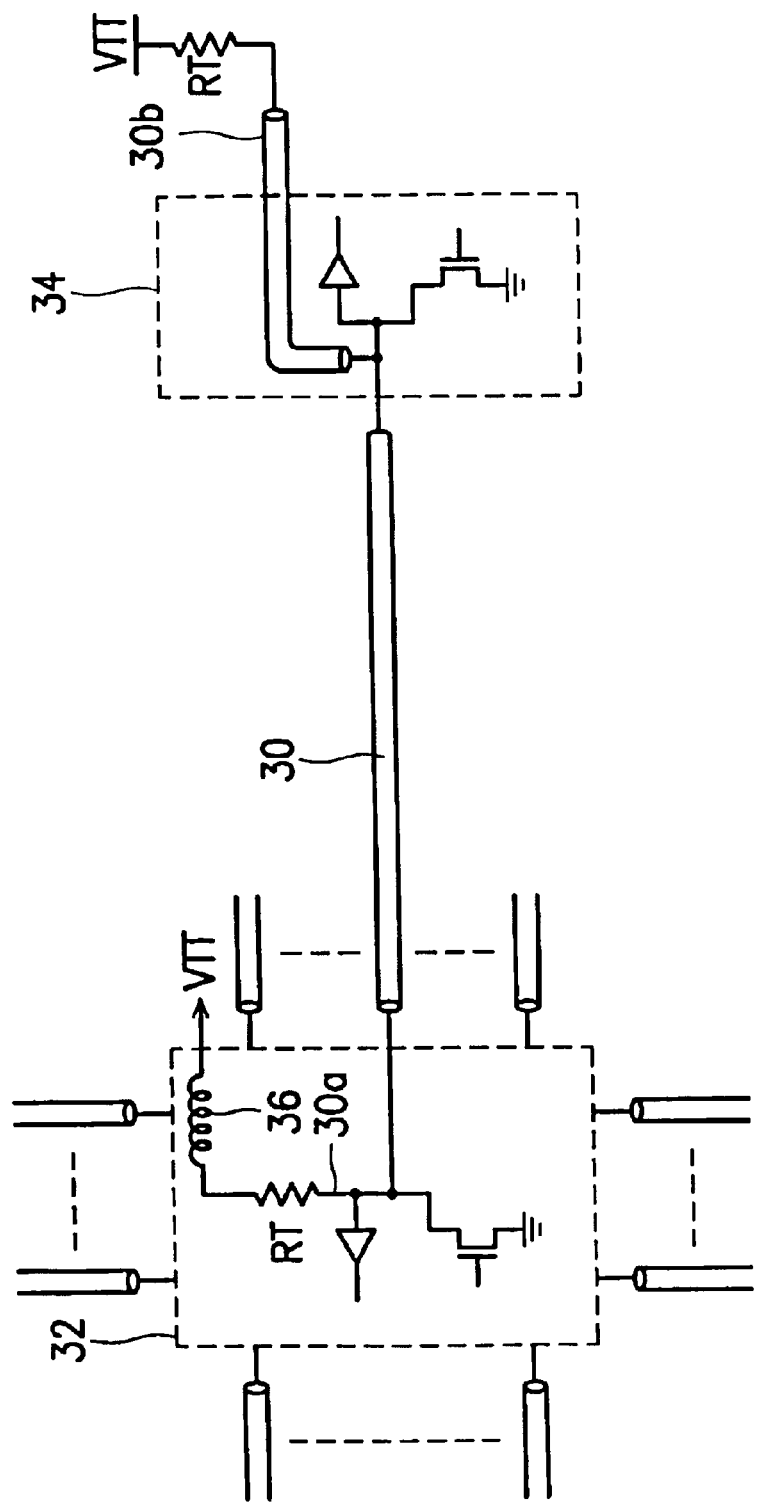
FIG. 7 (Prior Art) is a diagram illustrating the configuration of the conventional GTL bus when the termination resistors are placed within the IC.
Figure 8:
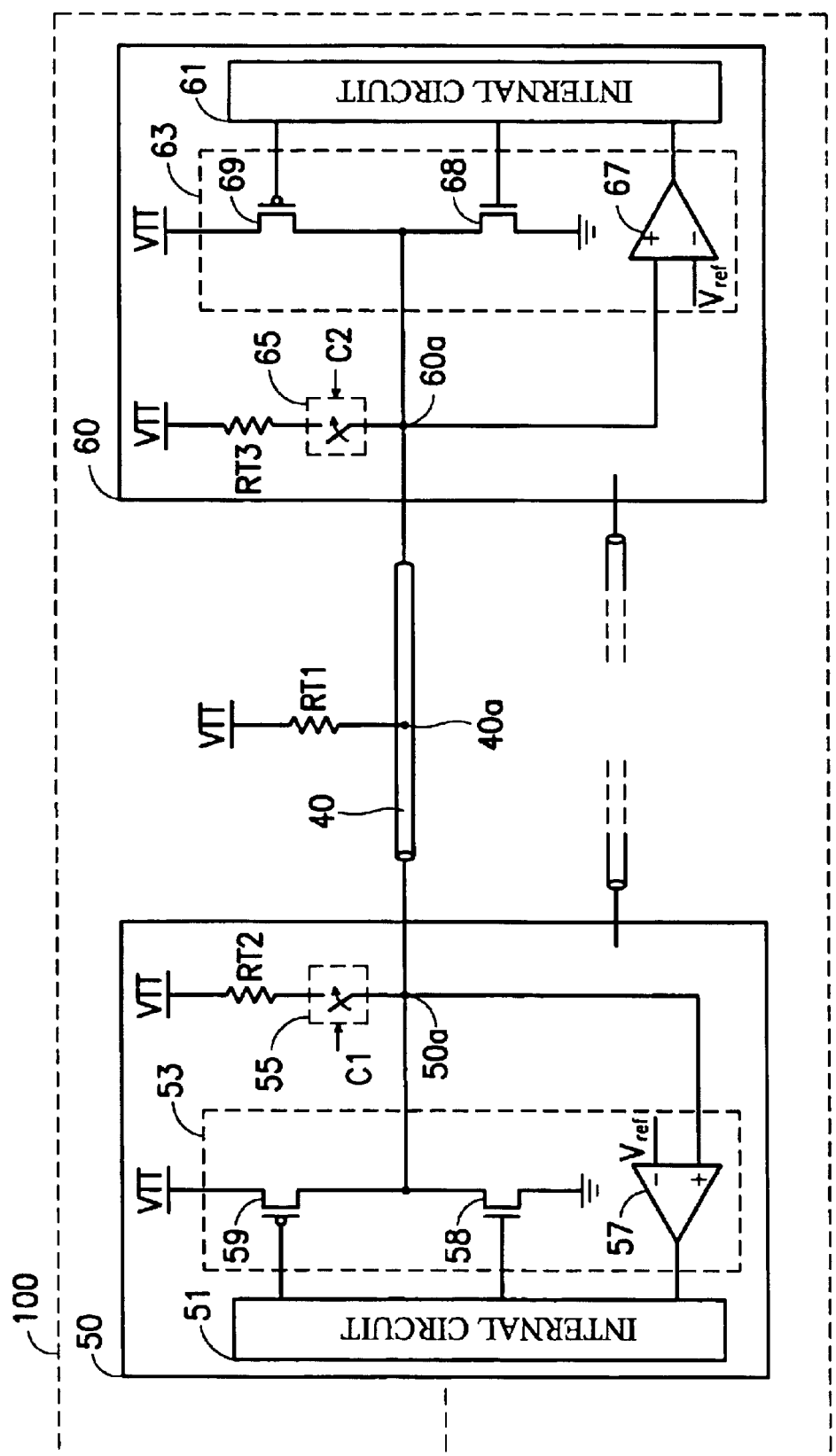
FIG. 8 is a diagram illustrating the configuration of the bus structure in accordance with the embodiment of the present invention.

FIG. 8 is a diagram illustrating the configuration of the bus structure in accordance with the embodiment of the present invention. In FIG. 8, numeral 100 represents a printed circuit board and numerals 50 and 60 represent different ICs, respectively. Note that a printed circuit board contains many components and devices. For clarity, FIG. 8 only illustrates the parts pertaining to the bus structure of the present invention.

A bus couples IC 50 and IC 60. In FIG. 8, transmission line 40 connected between I/O pin 50a of IC 50 and I/O pin 60a of IC 60 is one of the transmission lines in the bus. Note that other transmission lines in the bus can adopt the same structure as the transmission line 40 or other proper structures.

IC 50 includes an internal circuit 51 and an input/output circuit 53. Internal circuit 51 is coupled to the input/output circuit 53. The input/output circuit 53 further includes an input circuit, which mainly comprises a comparator 57, and an output circuit, which mainly comprises transistors 58 and 59 and couples to I/O pin 50a. Similarly, IC 60 includes an internal circuit 61 and an input/output circuit 63. Internal circuit 61 is coupled to the input/output circuit 63. The input/output circuit 63 further includes an input circuit, which mainly comprises a comparator 67, and an output circuit, which mainly comprises transistors 68 and 69 and couples to I/O pin 60a. When IC 50 functions as a transmitter and IC 60 functions as a receiver, internal circuit 51 of IC 50 can generate a required logic signal for transmission according to its predetermined function and send it to the output circuit of input/output circuit 53 (including transistors 58 and 59) for outputting to transmission line 40 via I/O pin 50a. At this time, the output of comparator 57 is ignored.

At the receiver (IC 60), the logic signal transmitted from transmission line 40 is sent to comparator 67 of input/output circuit 63 via I/O pin 60a. Then the received logic signal is transmitted to internal circuit 61 of IC 60. In this case, transistors 68 and 69 are in the OFF state. When the transmission direction is reverse, the transmission process is the same as that described above.

There are two features of the bus transmission architecture in the embodiment. The first feature is to place a middle resistor RT1 at a middle point 40a of transmission line 40. The other end of middle resistor RT1 is connected to a voltage source VTT. It is preferable that the resistance value of the middle resistor RT1 is the same as or close to the characteristic impedance $Z_0$ of transmission line 40. The second feature is to place pull-up resistors RT2 and RT3 within IC 50 and IC 60, respectively, for pulling up the rising voltage. As shown in FIG. 8, pull-up resistor RT2 is installed between I/O pin 50a and the voltage source VTT, and pull-up resistor RT3 is installed between I/O pin 60a and the voltage source VTT. Note that the resistance of the pull-up resistors RT2 and RT3 is preferably larger than the characteristic impedance $Z_0$ of the transmission line 40 for reducing noise. In this embodiment, the resistance of the pull-up resistors RT2 and RT3 is preferably between $2Z_0$ and $3Z_0$.

Pull-up resistor RT2 or RT3 works when IC 50 or IC 60 functions as the transmitter. For example, when IC 50 serves as a transmitter, internal circuit 51 can generate a signal to control transistors 58 and 59 of input/output circuit 53. When the control signal is logic LOW, transistor 58 is ON and transistor 59 is OFF. Then the output signal is driven to logic LOW by the turned-on transistor 58. When the control signal is logic HIGH, transistor 58 is OFF and transistor 59 is ON. At this time, the output signal is driven to logic HIGH by the turned-on transistor 59. Pull-up resistor RT3 of IC 60 serving as a receiver can be used to eliminate the phenomenon of rising-edge ringback. Since the function of the pull-up resistors RT2 and RT3 is to suppress the rising-edge ringback of the control signal, the paths involving the pull-up resistors RT2 and RT3 can be selectively turned on or turned off. As shown in FIG. 8, there is a switch element 55 located between the pull-up resistor RT2 and I/O pin 50a. In addition, there is a switch element 65 located between the pull-up resistor RT3 and I/O pin 60a. The two switch elements 55 and 65 are controlled by control signals C1 and C2, respectively, for selectively turning on or turning off the associated path.

Figure 9:
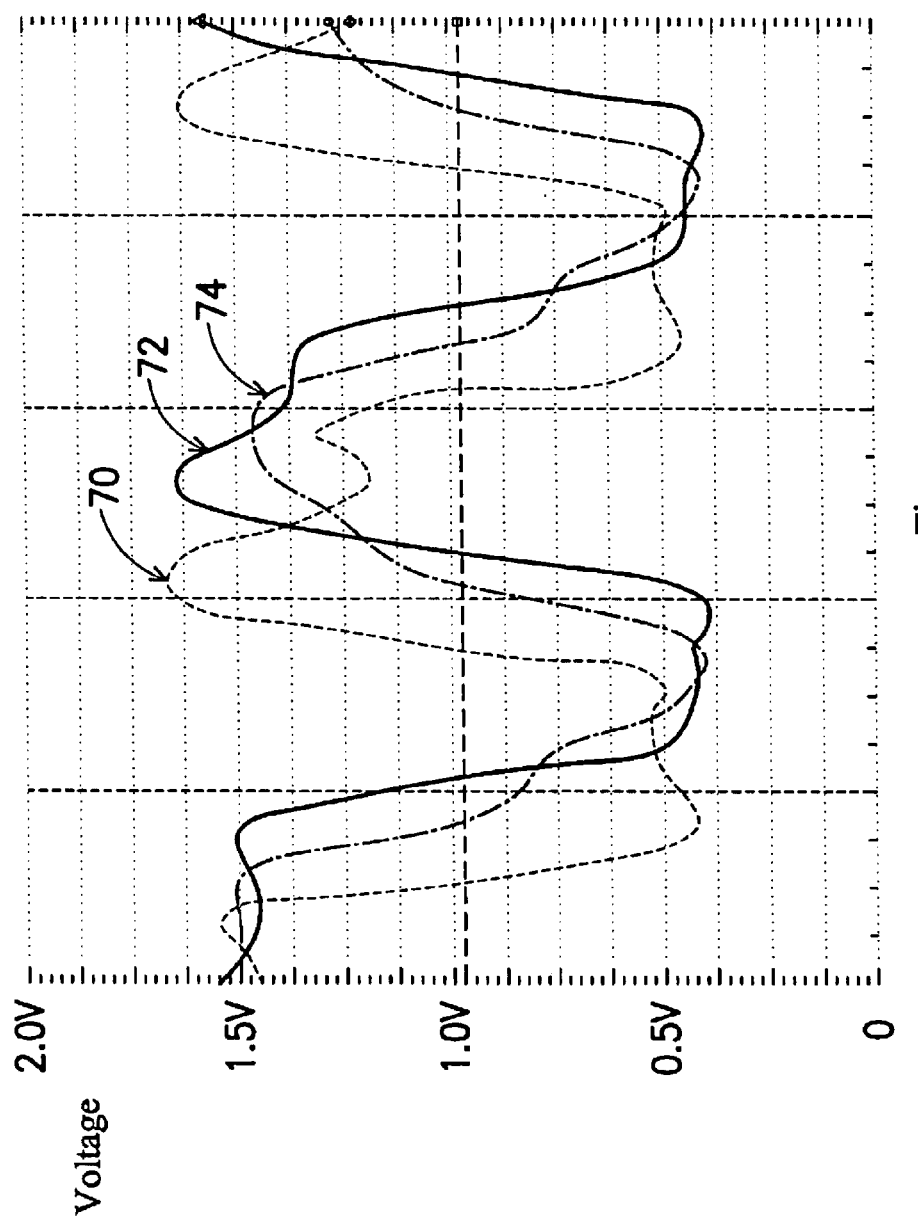
FIG. 9 is a waveform diagram of voltage signals on the transmitter, the receiver and the middle point of the transmission line shown in FIG. 8.

FIG. 9 is a waveform diagram of voltage signals on the transmitter, the receiver and the middle point of the transmission line shown in FIG. 8. In FIG. 9, numeral 70 denotes the voltage signal on the transmitter, numeral 72 denotes the voltage signal on the receiver and numeral 74 denotes the voltage signal on middle point 40a of the transmission line. As shown in FIG. 9, voltage signal 72 on the receiver is perfect. Voltage signal 70 on the transmitter can reach the steady state until the flight time passes but is very close to the voltage in the stable state (that is, 1.5V). In other words, the data transmission rate in this embodiment is not limited by the double of the flight time as in the conventional technology, thereby achieving the object of the present invention.

As described above, pull-up resistors RT2 and RT3 are installed within the ICs to reduce the rising-edge ringback in this embodiment, but also induce instantaneous noise L*dI/dT. However, since the resistance values of pull-up resistors RT2 and RT3 are preferably about 2 or 3 times of the characteristic impedance $Z_0$ of transmission line 40, the induced noise in this embodiment is far less than that induced by the termination resistors in the prior art. Therefore, another object of the present invention can be achieved.

It is understood by those skilled in the art that the resistance value of middle resistor RT1 can be different from the characteristic impedance $Z_0$. When the resistance value of the middle resistor RT1 changes, the resistance values of the pull-up resistors RT2 and RT3 ought to correspondingly change to achieve better circuitry performance. In the bus structure in the present embodiment, another advantage of placing a resistor with a resistance $Z_0$ in a middle point of transmission line 40 is to facilitate the circuit layout. More specifically, this resistor is placed far away from the wiring area of the IC. Accordingly, such a placement can be easily applied in the applications of the current ICs with dense wiring.

Finally, while the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded with the broadest interpretation so as to encompass all such modifications and similar arrangements.

What is claimed is:

1. A bus structure for transmitting data between a first circuit with a first I/O pin and a second circuit with a second I/O pin, comprising:

a transmission line connected between the first I/O pin of the first circuit and the second I/O pin of the second circuit;

a middle resistor having a first end coupled to a middle point of the transmission line and having a second end coupled to a voltage source;

the first circuit having a first pull-up resistor with a first end coupled to the first I/O pin of the first circuit and a second end coupled to the voltage source, the resistance of the first pull-up resistor being higher than a characteristic impedance of the transmission line; and the second circuit having a second pull-up resistor with a first end coupled to the second I/O pin of the second circuit and a second end coupled to the voltage source, the resistance of the second pull-up resistor being higher than the characteristic impedance of the transmission line.

2. The bus structure as recited in claim 1, wherein the resistance of the middle resistor is substantially the same as the characteristic impedance of the transmission line.

3. The bus structure as recited in claim 1, wherein the middle point is substantially a center between the first circuit and the second circuit on the transmission line.

4. The bus structure as recited in claim 1, wherein the resistance of the first pull-up resistor is between $2Z_0$ and $3Z_0$, where $Z_0$ is the characteristic impedance of the transmission line.

5. The bus structure as recited in claim 1, wherein the resistance of the second pull-up resistor is between $2Z_0$ and $3Z_0$, where $Z_0$ is the characteristic impedance of the transmission line.

6. The bus structure as recited in claim 1, further comprising a switch element located between the first pull-up resistor and the first I/O pin of the first circuit.

7. The bus structure as recited in claim 1, further comprising a switch element located between the second pull-up resistor and the second I/O pin of the second circuit.

8. A printed circuit board, comprising:

a first integrated circuit mounted on the printed circuit board and having a first I/O pin and a first pull-up resistor coupled to the first I/O pin and an external voltage source;

a second integrated circuit mounted on the printed circuit board and having a second I/O pin and a second pull-up resistor coupled to the second I/O pin and the external voltage source;

a transmission line provided on the printed circuit board between the first I/O pin of the first integrated circuit and the second I/O pin of the second integrated circuit, the resistance of the first pull-up resistor and the second pull-up resistor being higher than a characteristic impedance of the transmission line; and a middle resistor provided on the printed circuit board, the middle resistor having a first end coupled to a middle point between the first integrated circuit and the second integrated circuit on the transmission line and a second end coupled to the external voltage source.

9. The printed circuit board as recited in claim 8, wherein the resistance of the middle resistor is substantially the same as the characteristic impedance of the transmission line.

10. The printed circuit board as recited in claim 8, wherein the middle point is substantially a center between the first integrated circuit and the second integrated circuit on the transmission line.

11. The printed circuit board as recited in claim 8, wherein the resistance of the first pull-up resistor is between $2Z_0$ and $3Z_0$ where $Z_0$ is the characteristic impedance of the transmission line.

12. The printed circuit board as recited in claim 8, wherein the resistance of the second pull-up resistor is between $2Z_0$ and $3Z_0$ where $Z_0$ is the characteristic impedance of the transmission line.

13. The printed circuit board as recited in claim 8, further comprising a switch element located between the first pull-up resistor and the first I/O pin of the first integrated circuit.

14. The printed circuit board as recited in claim 8, further comprising a switch element located between the second pull-up resistor and the second I/O pin of the second integrated circuit.

* * * * *